US008817273B2

(12) United States Patent
Jeong et al.

(10) Patent No.: US 8,817,273 B2
(45) Date of Patent: Aug. 26, 2014

(54) DARK FIELD DIFFRACTION BASED OVERLAY

(75) Inventors: Hwan J. Jeong, Los Altos, CA (US);
Silvio J. Rabello, Palo Alto, CA (US);
Thomas Andre Casavant, Cupertino, CA (US)

(73) Assignee: Nanometrics Incorporated, Milpitas, CA (US)

( * ) Notice: Subject to any disclaimer, the term of this patent is extended or adjusted under 35 U.S.C. 154(b) by 304 days.

(21) Appl. No.: 13/454,870

(22) Filed: Apr. 24, 2012

(65) Prior Publication Data

US 2013/0278942 A1    Oct. 24, 2013

(51) Int. Cl.
*G01B 11/14* (2006.01)

(52) U.S. Cl.
USPC ............................ 356/620; 356/617; 356/622

(58) Field of Classification Search
USPC ...................... 356/237.1–241.6, 242.1–243.8, 356/426–431, 600–640
See application file for complete search history.

(56) References Cited

U.S. PATENT DOCUMENTS

| 5,585,923 | A | * | 12/1996 | Nose et al. | 356/490 |
|---|---|---|---|---|---|
| 5,672,520 | A | * | 9/1997 | Natsume | 356/401 |
| 5,805,866 | A | * | 9/1998 | Magome et al. | 716/51 |
| 7,046,361 | B1 | * | 5/2006 | Yang et al. | 356/401 |
| 7,375,810 | B2 | * | 5/2008 | Nikoonahad et al. | 356/401 |
| 7,508,976 | B1 | * | 3/2009 | Yang et al. | 382/151 |
| 7,525,659 | B2 | * | 4/2009 | Furman et al. | 356/400 |
| 7,633,041 | B2 | * | 12/2009 | Furman et al. | 250/201.2 |
| 7,656,528 | B2 | * | 2/2010 | Abdulhalim et al. | 356/401 |
| 7,791,732 | B2 | | 9/2010 | Den Boef et al. | |
| 2005/0012928 | A1 | * | 1/2005 | Sezginer et al. | 356/401 |
| 2008/0239318 | A1 | | 10/2008 | Den Boef et al. | |
| 2011/0043791 | A1 | | 2/2011 | Smilde et al. | |

OTHER PUBLICATIONS

Krukar, R. (Feb. 1, 1993). "Overlay and Grating Line Shape Metrology Using Optical Scatterometry: Final Report," Sandia Systems, Inc., 40 pages.

McNeil, J. et al. (Nov./Dec. 1992). "Scatterometry Applied to Microelectronics Processing," *Microlithography World*, pp. 16-22.

Yang, W. et al. (May 27, 2003). "A Novel Diffraction Based Spectroscopic Method for Overlay Metrology," *Proc. SPIE* 5038, Metrology, Inspection, and Process Control for Microlithography XVII, 8 pages.

International Search Report and Written Opinion mailed on Aug. 19, 2013 for International Application No. PCT/US2013/034479 filed on Mar. 28, 2013 by Nanometrics Incorporated, 10 pages.

* cited by examiner

*Primary Examiner* — Kara E. Geisel
*Assistant Examiner* — Jarreas C Underwood
(74) *Attorney, Agent, or Firm* — Silicon Valley Patent Group LLP

(57) ABSTRACT

A dark field diffraction based overlay metrology device illuminates an overlay target that has at least three pads for an axis, the three pads having different programmed offsets. The overlay target may be illuminated using two obliquely incident beams of light from opposite azimuth angles or using normally incident light. Two dark field images of the overlay target are collected using $\pm 1^{st}$ diffraction orders to produce at least six independent signals. For example, the $+1^{st}$ diffraction order may be collected from one obliquely incident beam of light and the $-1^{st}$ diffraction order may be collected from the other obliquely incident beam of light. Alternatively, the $\pm 1^{st}$ diffraction orders may be separately detected from the normally incident light to produce the two dark field images of the overlay target. The six independent signals from the overlay target are used to determine an overlay error for the sample along the axis.

32 Claims, 7 Drawing Sheets

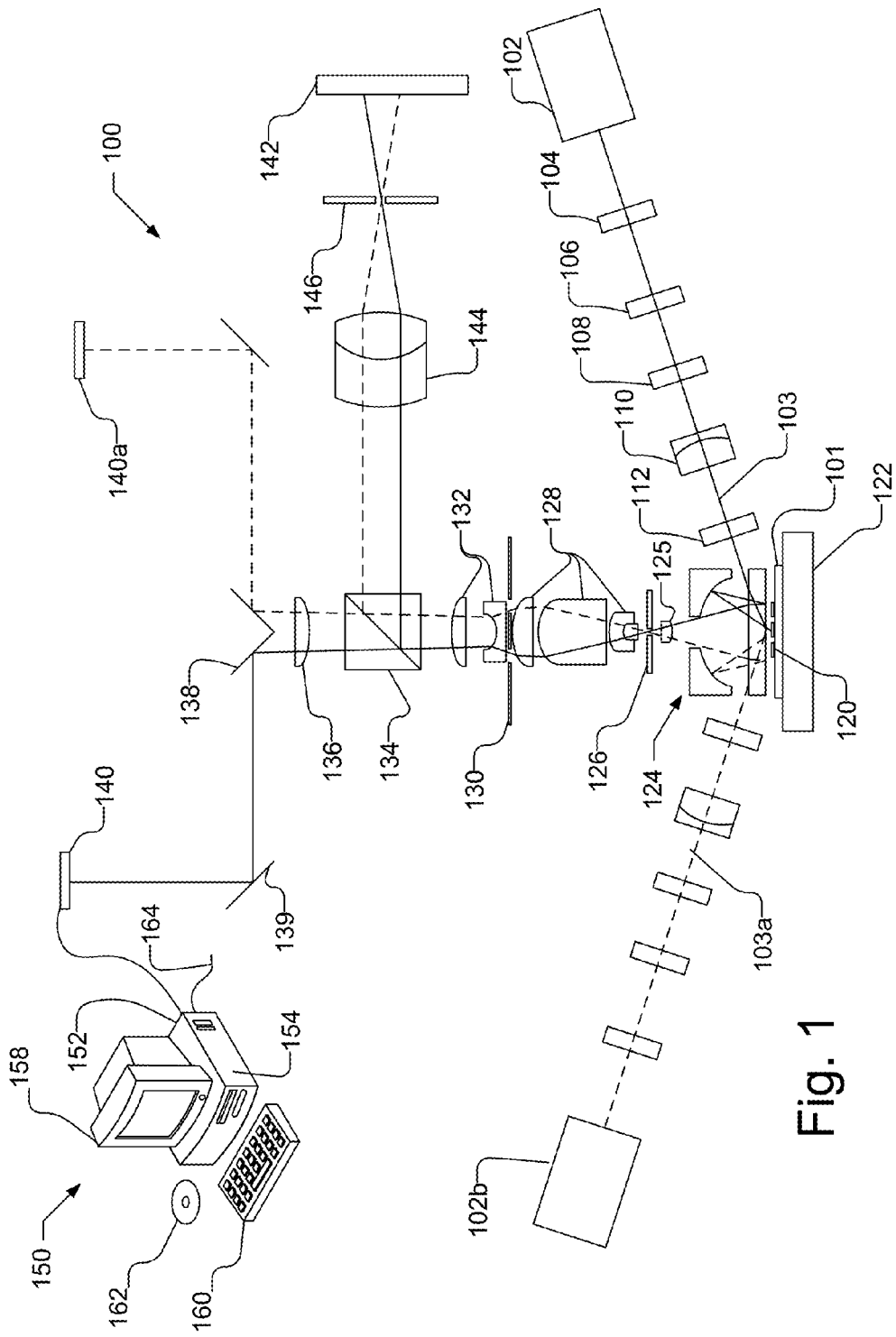

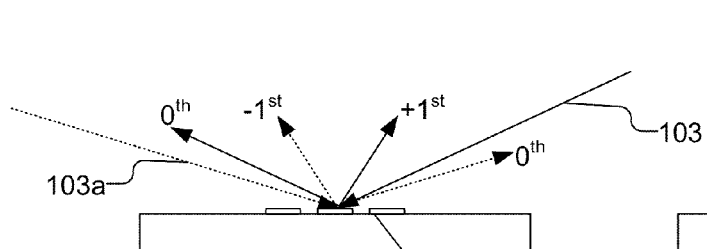
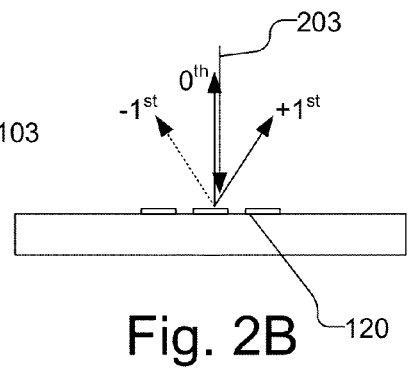
Fig. 2A  Fig. 2B
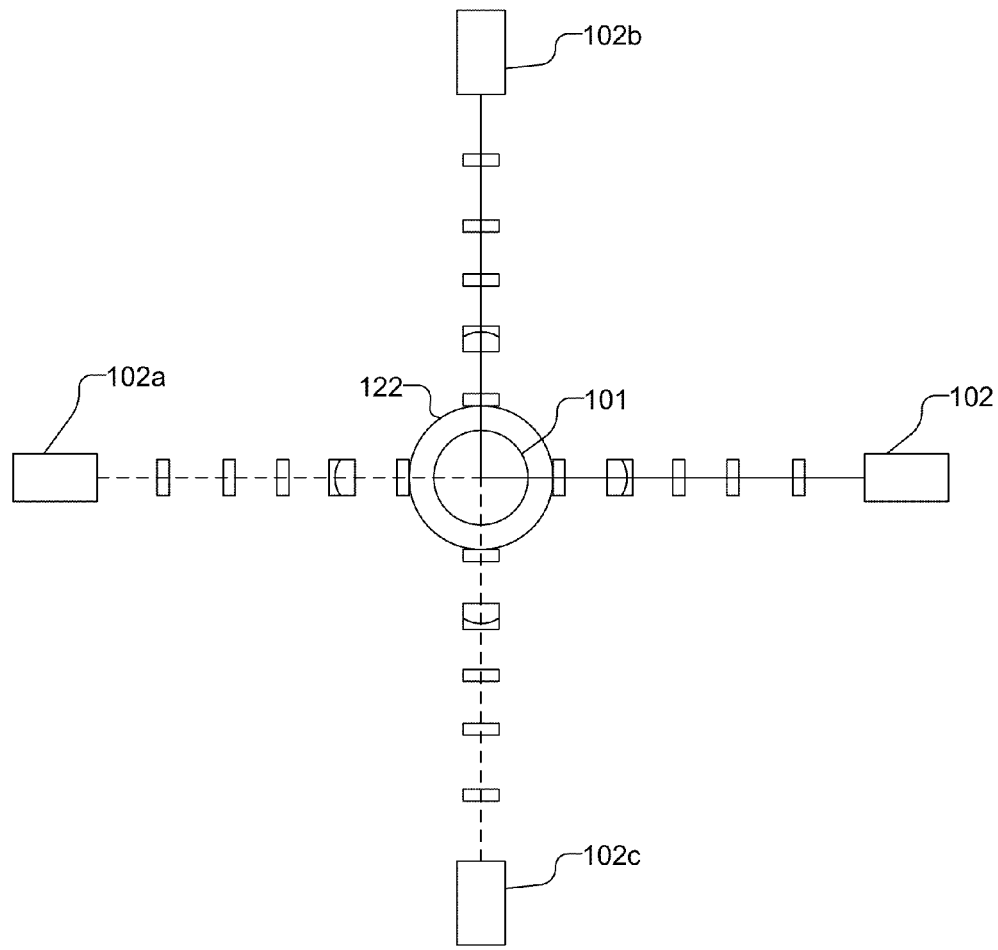
Fig. 3

DARK FIELD DIFFRACTION BASED OVERLAY

FIELD OF THE INVENTION

The invention relates to an optical metrology of overlay error and more particularly to measuring diffraction based overlay error.

BACKGROUND

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically, the photomask has alignment targets or keys that are aligned to fiduciary marks formed in the previous layer on the substrate. However, as the size of integrated circuit features continues to decrease, it becomes increasingly difficult to measure the overlay accuracy of one masking level with respect to the previous level. This overlay metrology problem becomes particularly difficult at submicrometer feature sizes where overlay alignment tolerances are reduced to provide reliable semiconductor devices. One type of overlay measurement is known as diffraction based overlay metrology.

One type of diffraction based overlay metrology uses bright field optics in which specular light, i.e., $0^{th}$ diffraction order, is used to determine an overlay error. Another type of diffraction based overlay metrology uses dark field optics, which uses non-specular light to determine the overlay error. Both types of diffraction based overlay metrology uses targets composed of overlying diffraction gratings. However, the targets used in bright field and dark field diffraction based overlay metrology are not interchangeable.

SUMMARY

A dark field diffraction based overlay metrology device illuminates an overlay target that has at least three pads for an axis, the three pads have different programmed offsets. By way of example, the overlay target may be illuminated using two obliquely incident beams of light from opposite azimuth angles or using normally incident light. Two dark field images of the overlay target are collected using $\pm 1^{st}$ diffraction orders to produce at least six independent signals from the overlay target. For example, the $+1^{st}$ diffraction order may be collected from one obliquely incident beam of light and the $-1^{st}$ diffraction order may be collected from the other obliquely incident beam of light. Alternatively, the $\pm 1^{st}$ diffraction orders may be separately detected from the normally incident light to produce the two dark field images of the overlay target. The six independent signals from the overlay target are used to determine an overlay error for the sample along the axis.

BRIEF DESCRIPTION OF THE DRAWINGS

FIG. 1 schematically illustrates a side view of a dark field diffraction based overlay metrology device that uses obliquely incident light.

FIGS. 2A and 2B illustrate the generation of $\pm 1^{st}$ diffraction orders from obliquely incident light and normal incident light, respectively.

FIG. 3 schematically illustrates a top view of the dark field diffraction based overlay metrology device.

DETAILED DESCRIPTION

Figure 4:
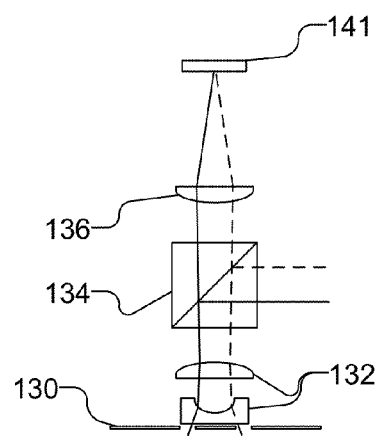
FIG. 4 illustrates a portion of the imaging beam path of the metrology device using a single detector.

FIG. 1 illustrates a dark field diffraction based overlay metrology device 100. The metrology device 100 measures the overlay error using one or more overlay targets with three or more pads per axis, which eliminates zero-sensitivity problems in overlay measurements and may eliminate sensitivity to film thickness or its variation in the resulting overlay measurement.

Conventional dark field diffraction based overlay metrology devices use a single overlay error solution that has minimum (potentially zero) sensitivity, i.e., measurement null, for particular structure parameters, e.g., when film thicknesses introduce an integral it phase shift in the probe light, which is known as the zero-sensitivity problem. In contrast, the metrology device 100 acquires dark field images of an overlay target with at least three pads, which have different programmed offsets, and uses the $\pm 1^{st}$ diffraction orders separately to produce six nominally independent signals for each axis. The six independent signals may be used to yield a plurality of overlay error solutions, such that at least two of the overlay error solutions have a measurement null for different structure parameters. Accordingly, the overlay error solutions may be used together, i.e., individually or in combination, to eliminate the zero sensitivity problem.

The metrology device 100 is a high numerical aperture (NA) optical imaging system. An overlay target 120 on a sample 101 is placed in the object plane of the metrology device 100. A dark field image of the overlay target 120 is formed in the image plane, which is detected by one or more image sensors to detect the intensity distribution of the image. The metrology device 100 uses oblique incidence light that is incident over all the pads of the overlay target 120. The light source 102 for the metrology device 100 may be e.g., a monochromatic light source, such as a laser, or a polychromatic light source, such as an arc lamp. If desired, multiple wavelengths, e.g., from one or more light sources may be used for different types of materials. The light source 102 produces a first light beam 103 that is incident on the sample 101 at an oblique angle, e.g., between 0° to 80°, e.g., 73°. As illustrated, the beam path of the light source 102 may include optical elements, such as an attenuator 104, half-wave plate 106, polarizer 108, doublet lens 110 and a window 112. Fewer, additional or alternative optical elements may be used in the light source beam path. The selection of the polarization state, e.g., TE (s-polarization) or TM (p-polarization) of polarizer 108 may be determined empirically based on the structure of the overlay target.

The light beam 103 is incident on a diffraction overlay target 120 on sample 101, which is held on a stage 122. The gratings in each pad of the overlay target 120 diffract the incoming illumination light. The metrology device 100 includes dark field imaging optics and at least one detector to collect dark field images of the overlay target 120. Each pad in the overlay target 120 diffracts a part of the illuminating light beam 103 and the +1$^{st}$ diffraction order is collected by the objective lens 124. The objective lens 124 may be, e.g., catadioptic, catoptic, or dioptric or any other type of lens system. The diffracted light passes through an imaging beam path including several additional optical elements, including a lens 125, an optional field aperture 126, one or more lenses 128, a pupil aperture plate 130, one or more lenses 132, beam splitter 134, lens 136, and a fold mirror assembly 138. The imaging beam path is configured to produce a dark field image at the image plane, which is of the overlay target 120, which is received by a detector 140 via the fold mirror assembly 138. By imaging the overlay target 120 at the image plane, metrology device 100 is able to capture signals from all three pads in the overlay target simultaneously, which is advantageous to increase throughput. In comparison, conventional DBO systems typically image the pupil plane, and thus, must separately probe each pad in an overlay target. Consequently, conventional DBO systems require movement of the sample and/or field aperture to separately probe each pad which adversely effects throughput and requires relatively large pads that can be individually probed by the illuminating light.

As illustrated in FIG. 1, a beam splitter 134 splits a portion of the diffracted light and images the pupil aperture plate 130 located at the pupil plane of the imaging system on a separate detector 142 via lens 144 and optional iris 146. The image of the pupil aperture plate 130 on detector 142 may be used to determine whether the angle of incidences of the beams 103 and 103a are correct and symmetrical, e.g., by analyzing the location of the focused spots in the resulting image of the pupil aperture plate 130.

As can be seen, the metrology device 100 includes a second light source 102a, which produces the second light beam 103a with the same angle of incidence as the first light beam 103, but with an opposite azimuth angle, i.e., the azimuth angles of light beam 103 and light beam 103 differ by 180°. It should be understood that the same angle of incidence and the opposite azimuth angle refer to angles that are nominally the same, as opposed to being precisely the same, where nominally means that the Bi-Directional Reflection Distribution Function satisfies the tolerance dictated by the pitch of the gratings and the size of the aperture used. The second light beam 103a is diffracted by the overlay target 120 and the −1$^{st}$ diffraction order is received by objective lens 124, passes through the optical elements including the pupil aperture plate 130 and is received by a detector 140a. Thus, as illustrated in FIG. 2A, the overlay target 120, which includes at least three pads, is illuminated in a first direction by the light beam 103 to produce and collect +1$^{st}$ diffraction order, and is illuminated at the opposite azimuth angle by light source 103a to produce and collect the −1$^{st}$ diffraction order. It should be understood that FIG. 2 illustrates the angle of incidence of the light beams 103 and 103a as different simply for clarity, and that metrology device 100 uses the same angle of incidence for both light beams 103 and 103a. Thus, dark field images of the overlay target 120 are produced from both the +1$^{st}$ diffraction order and the −1$^{st}$ diffraction order. The overlay target 120 includes at least three independent pads and, thus, a total of at least six independent signals are captured.

Additionally, metrology device 100 may include a third light source 102b and a fourth light source 102c, which are arranged with azimuth angles that are nominally orthogonally to the azimuth angles of the light source 102 and light source 102a, as show in a top view in FIG. 3. The light beams produced by light sources 102b and 102c are similarly diffracted from overlay target 120 or from an orthogonally aligned overlay target, and received by objective lens 124, passes through the optical elements including the pupil aperture plate 130 and are received by one or more detectors. Thus, a second set of at least six independent signals are captured for the orthogonal axis. Additionally, when stage 122 is an R-θ stage, the overlay target 120 may be positioned such that the light sources 102, 102a, 102b, and 102c may have relatively large azimuth angles with respect to the diffraction gratings. Accordingly, when using an R-θ stage it may be desirable to include an additional set of four orthogonal light sources that are oriented 45° with respect to light sources 102, 102a, 102b, and 102c, to ensure that the ±1$^{st}$ diffraction order light is collected by the imaging systems, which has a limited NA. When eight light sources are used with metrology device 100, it may be advantageous to use a single detector.

Separate detectors 140 and 140a are illustrated in FIG. 1, however, if desired, the detectors may be combined into a single detector, as illustrated by detector 141 in FIG. 4. FIG. 4 illustrates pupil aperture plate 130, lenses 132, beam splitter 134 and lens 136. Instead of using fold mirror assembly 138, 139 and multiple detectors being used, a single detector 141 is used. With use of a single detector 141, the +1$^{st}$ diffraction order and the −1$^{st}$ diffraction order from the overlay target 120 are captured by the detector 141 sequentially.

Figures 5, 6:
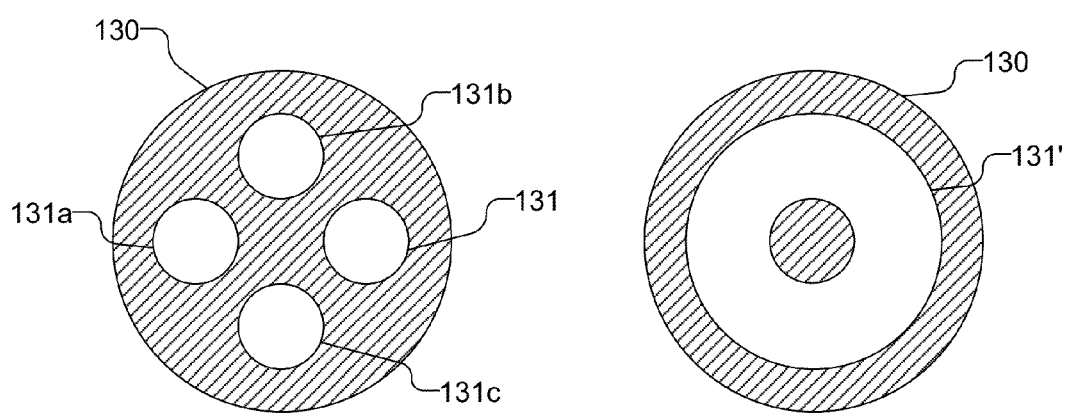
FIG. 5 illustrates a pupil aperture plate that may be used in the dark field imaging optics of the dark field diffraction based overlay metrology device.
FIG. 6 illustrates another pupil aperture plate that may be used in the dark field imaging optics of the dark field diffraction based overlay metrology device

FIG. 5 illustrates the pupil aperture plate 130 that may be used in the dark field imaging optics of the dark field diffraction based overlay metrology device 100. The pupil aperture plate 130 includes a plurality off-center apertures 131, 131a, 131b, and 131c, through which the diffracted light resulting from light sources 102, 102a, 102b, and 102c, respectively, passes. If desired, as illustrated in FIG. 6, a pupil aperture plate 130' may include a single annular aperture 131' instead of a plurality of separate apertures. The use of a single annular aperture 131' may be particularly useful when stage 122 is an R-θ stage, as opposed to an XY stage.

The detectors of metrology device 100 are coupled to a computer 150, which analyzes the data provided by the detectors. Computer 150 includes a processor 152 with memory 154, as well as a user interface including e.g., a display 158 and input devices 160. A non-transitory computer-usable medium 162 having computer-readable program code embodied may be used by the computer 150 for causing the processor to control the metrology device 100 and to perform the functions including the analysis described herein. The data structures and software code for automatically implementing one or more acts described in this detailed description can be implemented by one of ordinary skill in the art in light of the present disclosure and stored, e.g., on a computer readable storage medium 162, which may be any device or medium that can store code and/or data for use by a computer system such as processor 152. The non-transitory computer-usable medium 162 may be, but is not limited to, magnetic and optical storage devices such as disk drives, magnetic tape, compact discs, and DVDs (digital versatile discs or digital video discs). A communication port 164 may also be used to receive instructions that are used to program the computer 150 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Figure 7:
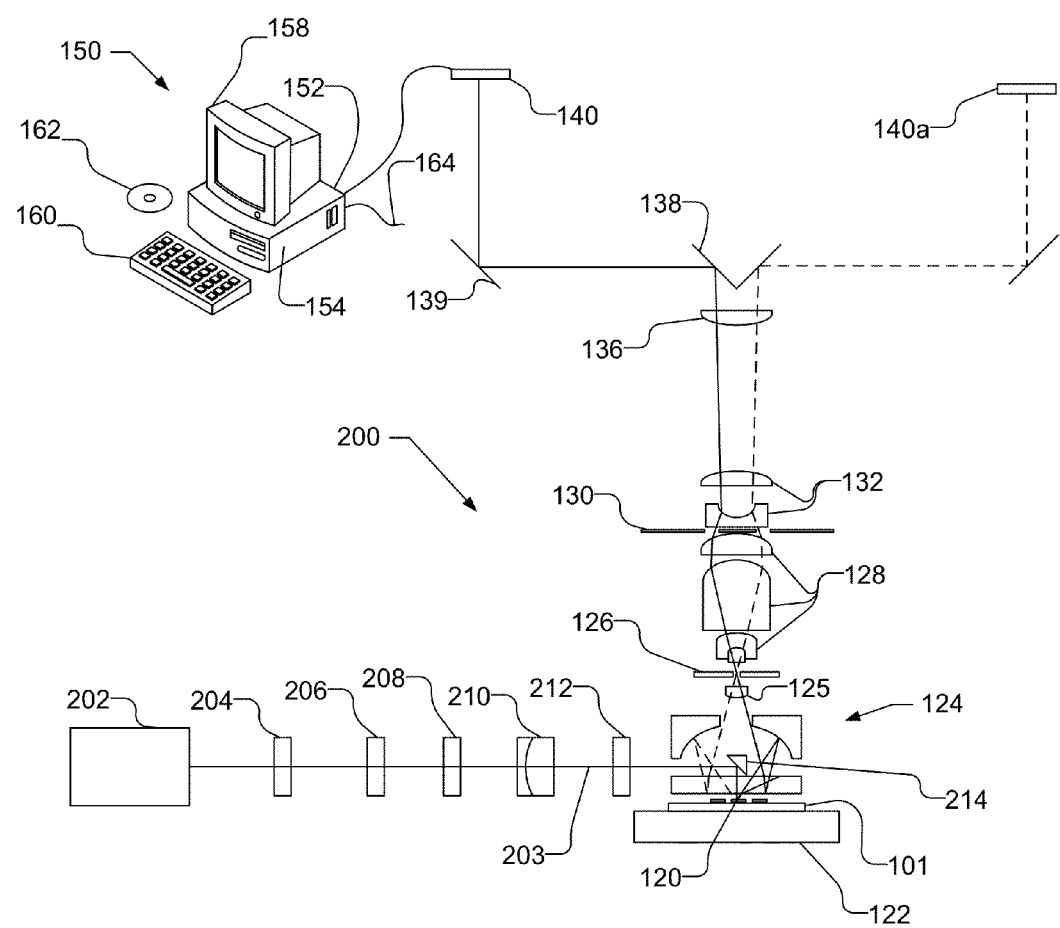
FIG. 7 illustrates another implementation of a dark field diffraction based overlay metrology device that uses normally incident light.

FIG. 7 illustrates another implementation of a dark field diffraction based overlay metrology device 200, which is similar to metrology device 100 shown in FIG. 1, like designated elements being the same, but in which normal incidence light is used instead of oblique incidence light. As illustrated, normal incidence illumination may be provided with a light source 202, which produces a light beam 203 that is reflected by fold mirror 214 to be normally incident on the overlay target 120. The beam path of the light source 202 may include optical elements, such as an attenuator 204, half-wave plate 206, polarizer 208, doublet lens 210 and a window 212, similar to metrology device 100 shown in FIG. 1. Fewer, additional or alternative optical elements may be used in the light source beam path. As illustrated in FIG. 2B, the overlay target 120 is illuminated by the normal incidence light beam 203 resulting in the production of the $+1^{st}$ diffraction order and the $-1^{st}$ diffraction order. The +1st normal incidence metrology device 200 collects the dark field images produced by the diffraction orders, similar to metrology device 100 described above.

Metrology device 100 is a diffraction based overlay measurement system and thus, the overlay target 120 is made of gratings that diffract the illumination light to produce the overlay error signal. In order to measure the overlay error between two process layers, the overlay target 120 includes gratings that overlie each other on the process layers. Moreover, overlay target 120 includes multiple (at least three) target pads, each of which includes two overlaying grating pairs (one grating on each process layer). The overlay error is determined by measuring the relative lateral distance between the gratings pairs in the overlay target 120.

Figure 8:
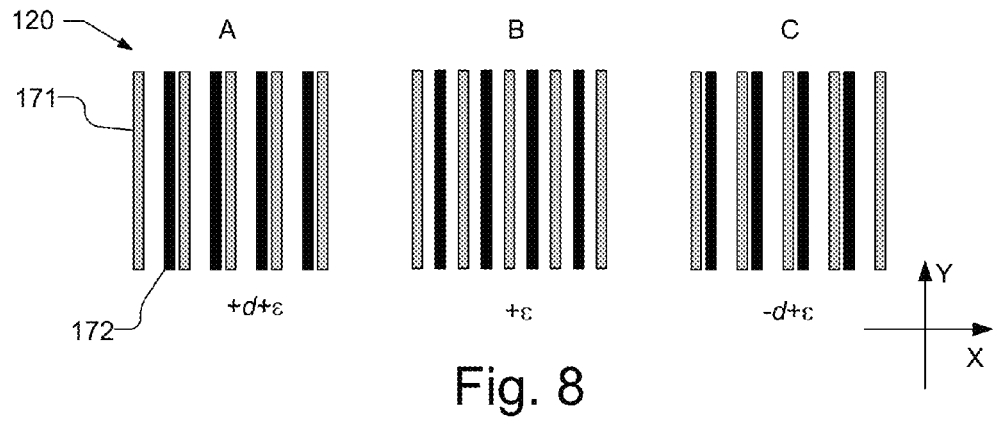
FIG. 8 illustrates an overlay target that may be used with the dark field diffraction based overlay metrology device.
Figure 9:
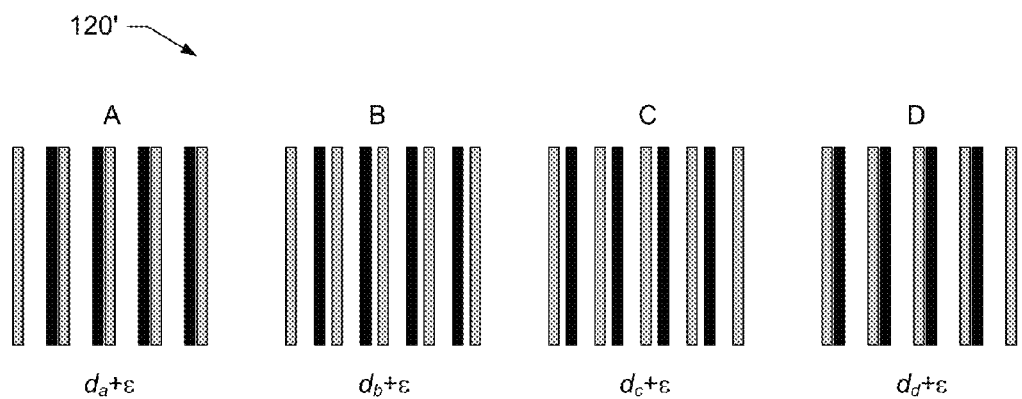
FIG. 9 illustrates another overlay target, with an additional pad, that may be used with the dark field diffraction based overlay metrology device.

FIG. 8 illustrates the overlay target 120, which is used for a single direction, e.g., the X coordinate axis. A similar overlay target, but orthogonally aligned to overlay target 120 may be used for the orthogonal direction, e.g., the Y coordinate axis. The overlay target 120 is illustrated as including three pads, labeled A, B, and C. Each pad includes two interleaved gratings 171 and 172, which are associated with separate process steps and may be deposited on overlaying layers (which may be directly overlaying or may include one or more intervening layer) or may be deposited on the same layer. The use of the same number of grating lines for both gratings 171 and 172 may be problematic, therefore, a different number of grating lines may be used for the two interleaving target gratings 171 and 172, as illustrated in FIG. 8. The overlay target 120 includes three pads, each having a different programmed offset. As illustrated in FIG. 8, pads A and C, having equal but opposite programmed offsets, i.e., pad A has an offset of +d+ϵ, while pad C has an offset of −d+ϵ, where ϵ is the overlay error and |d| is the magnitude of the programmed offset. Pad B in FIG. 8 is illustrated as having no programmed offset from the interleaved positions of the gratings. Thus, as illustrated in FIG. 8, overlay target 120 may have a folding symmetry along the direction of measurement, e.g., the X coordinate axis. Folding symmetry in overlay target 120, however, is not required and may be avoided, e.g., by rearranging the pads A and B or pads B and C, or alternatively by providing a programmed offset in pad B and/or different magnitude programmed offsets in pads A and C. Additionally, the pads may all have programmed offsets in the same direction but different magnitudes. Additionally, additional pads may be used in overlay target, where at least three of the pads have different programmed offsets. FIG. 9, by way of example, illustrates a four pad overlay target 120', where pads A, B, C, and D, have programmed offsets of $d_a$, $d_b$, $d_c$, and $d_d$. If desired, $d_a$ and $d_d$ may be equal in magnitude and opposite in direction, while $d_b$ and $d_c$ are equal in magnitude and opposite in direction, but differ from $d_a$ and $d_d$.

The use of at least three pads in the overlay target each having different programmed offsets is advantageous at it permits measurement of overlay error by the metrology device 100 or 200 with a minimum (potentially no) zero-sensitivity problems in overlay measurements and may eliminate sensitivity to film thickness or its variation in the resulting overlay measurement.

Figure 10:
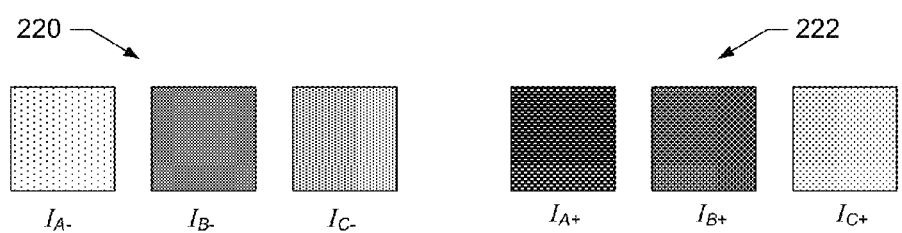
FIG. 10 illustrates a dark field images of the overlay target captured using the $\pm 1^{st}$ diffraction orders.

As discussed above, the metrology devices 100 and 200 capture dark field images with the $\pm 1^{st}$ diffraction orders from each of the pads in the overlay target 120 using obliquely incident or normally incident light. It should be understood, that the dark field images may not resolve the grid lines within the pads of the overlay target 120, but may provide an intensity level associated with each of pad. FIG. 10, by way of example, illustrates a dark field image 220 of the overlay target 120 captured using the $-1^{st}$ diffraction order and a dark field image 222 of the overlay target 120 captured using the $+1^{st}$ diffraction order. As illustrated in FIG. 10, the grid lines in the pads of the overlay target 120 are not resolved in the dark field images 220 and 222, but the general intensity I for each pad is detected. Thus, with the use of two diffraction orders ($\pm 1^{st}$ diffraction orders) and a target with three pads A, B, and C, six independent signals for the overlay target 120 are acquired, and are labeled in FIG. 10 as $I_{A-}$, $I_{B-}$, $I_{C-}$ for dark field image 220 and $I_{A+}$, $I_{B+}$, $I_{C+}$ for dark field image 222. Of course, if additional pads are used in the overlay target, as illustrated in FIG. 9, additional independent signals may be acquired. Thus, at least six independent signals are acquired.

The measurement of overlay error may be based on the following:

Diffraction Equations

U(x), the complex amplitude of illumination beam on a target, can be expressed as follows.

$$U(x) = \exp(i2\pi K_{ill}x + \varphi_{ill}) \tag{1-1}$$

$$\text{where } K_{ill} = \frac{\sin(\theta)}{\lambda} \text{ where } \theta \text{ is the incidence angle of illumination beam} \tag{1-2}$$

$$\varphi_{ill} \text{ is the phase of illumination beam} \tag{1-3}$$

Then, the complex amplitude of $\pm 1^{st}$ diffraction orders from two interleaving target gratings can be expressed as $$E(x) = U(x)[2a\cos(2\pi Kx) - 2b\exp(i)\cos(2\pi K(x-x_0))] \tag{2-1}$$

$$= (a - b\exp(i(\varphi + 2\pi Kx_0)))\exp(i2\pi(K_{ill} - K)x + \varphi_{ill}): \tag{2-2}$$

$-1^{st}$ diffraction order +

$$(a - b\exp(i(\varphi - 2\pi Kx_0)))\exp(i2\pi(K_{ill} + K)x + \varphi_{ill}): \tag{2-3}$$

$+1^{st}$ diffraction order $$\text{where } K = \frac{1}{p} \text{ where } p \text{ is grating pitch} \tag{2-4}$$

$$a = \text{Diffraction amplitude of grating 1} \tag{2-5}$$

-continued $b$ = Diffraction amplitude of grating 2 (2-6)

$x_0$ = Lateral offset between the two gratings (2-7)

$$\varphi \approx 2\pi \frac{OPD\begin{pmatrix} \text{Optical Pathlength Difference between} \\ \text{the two gratings} \end{pmatrix}}{\lambda} \quad (2\text{-}8)$$

It is noted that φ strongly depends on wavelength and the film thickness between the two interleaving target gratings. It also depends on the height and duty cycle differences between the two target gratings. When the incidence angle of the illumination beam is zero or small, i.e., normal or near normal incidence, we can get both $\pm 1^{st}$ diffraction orders at the same time with single illumination beam, as illustrated in FIG. 5. However, if the incidence angle of illumination beam is large, we may not be able to get both diffraction orders with single illumination beam because one of the diffraction orders can go out of the collection optics or become non-radiating evanescent wave. In this case, the target is illuminated using a beam of opposite incidence angle to get both $\pm 1^{st}$ diffraction orders, as illustrated in FIG. 1. The two illumination beams may need to be turned on at different times to avoid the interference of diffracted light from the two beams at the detector plane. Additionally, if the beam incidence angle is extremely large, one of the diffraction orders can become evanescent or non-radiative even inside the sample. This can reduce the undesirable high order coupling between the two gratings.

From equations (2-2) and (2-3), $E_-$ and $E_+$, the complex amplitudes of $\pm 1^{st}$ diffraction orders, become $E_- = a - b\exp(i(\phi + 2\pi K x_0))$: Complex amplitude of $-1^{st}$ diffraction order (3-1)

$E_+ = a - b\exp(i(\phi - 2\pi K x_0))$: Complex amplitude of $+1^{st}$ diffraction order (3-2)

From equations (3-1) and (3-2), $I_-$ and $I_+$, the intensity of $\pm 1^{st}$ diffraction orders become $$I_- = |E_{-1}|^2 \quad (4\text{-}1)$$
$$= a^2 + b^2 - 2ab\cos(\varphi + 2\pi K x_0):$$
Intensity of $-1^{st}$ diffraction order
$$= a^2 + b^2 - 2ab(\cos(\varphi)\cos(2\pi K x_0) - \sin(\varphi)\sin(2\pi K x_0)) \quad (4\text{-}2)$$

$$I_+ = |E_{+1}|^2 \quad (4\text{-}3)$$
$$= a^2 + b^2 - 2ab\cos(\varphi - 2\pi K x_0):$$
Intensity of $+1^{st}$ diffraction order
$$= a^2 + b^2 - 2ab(\cos(\varphi)\cos(2\pi K x_0) + \sin(\varphi)\sin(2\pi K x_0)) \quad (4\text{-}4)$$

In the above equations, the overlay information is contained in the last term. The first two terms, $a^2+b^2$, do not carry overlay information and are a source of photon noise. This means that the signal-to-noise ratio will be highest when the diffraction efficiencies of the two interleaving gratings are the same.

The intensity of $\pm 1^{st}$ diffraction orders from each target pad A, B, and C, illustrated in overlay target 120 in FIG. 6, can be calculated using equations (4-2) and (4-4) as follows.

A-target pad: $x_0 = +d + \varepsilon$ $$I_{A-} = a^2 + b^2 - 2ab\cos(\phi + 2\pi K(d + \varepsilon)) \quad (5\text{-}1)$$
$$= a^2 + b^2 - 2ab\begin{bmatrix} \cos(\varphi)(\cos(2\pi Kd)\cos(2\pi K\varepsilon) - \sin(2\pi Kd)\sin(2\pi K\varepsilon)) - \\ \sin(\varphi)(\sin(2\pi Kd)\cos(2\pi K\varepsilon) + \cos(2\pi Kd)\sin(2\pi K\varepsilon)) \end{bmatrix} \quad (5\text{-}2)$$

$$I_{A+} = a^2 + b^2 - 2ab\cos(\phi + 2\pi K(d + \varepsilon)) \quad (5\text{-}3)$$
$$= a^2 + b^2 - 2ab\begin{bmatrix} \cos(\varphi)(\cos(2\pi Kd)\cos(2\pi K\varepsilon) - \sin(2\pi Kd)\sin(2\pi K\varepsilon)) + \\ \sin(\varphi)(\sin(2\pi Kd)\cos(2\pi K\varepsilon) + \cos(2\pi Kd)\sin(2\pi K\varepsilon)) \end{bmatrix} \quad (5\text{-}4)$$

B-target pad: $x_0 = +\varepsilon$ $$I_{B-} = a^2 + b^2 - 2ab\cos(\phi + 2\pi K\varepsilon)) \quad (6\text{-}1)$$
$$= a^2 + b^2 - 2ab[\cos(\varphi)\cos(2\pi K\varepsilon) - \sin(\varphi)\sin(2\pi K\varepsilon)] \quad (6\text{-}2)$$

$$I_{B+} = a^2 + b^2 - 2ab\cos(\varphi - 2\pi K\varepsilon)) \quad (6\text{-}3)$$
$$= a^2 + b^2 - 2ab[\cos(\varphi)\cos(2\pi K\varepsilon) + \sin(\varphi)\sin(2\pi K\varepsilon)] \quad (6\text{-}4)$$

C-target pad: $x_0 = -d + \varepsilon$ $$I_{C-} = a^2 + b^2 - 2ab\cos(\phi + 2\pi K(-d + \varepsilon)) \quad (7\text{-}1)$$
$$= a^2 + b^2 - 2ab\begin{bmatrix} \cos(\varphi)(\cos(2\pi Kd)\cos(2\pi K\varepsilon) + \sin(2\pi Kd)\sin(2\pi K\varepsilon)) + \\ \sin(\varphi)(\sin(2\pi Kd)\cos(2\pi K\varepsilon) - \cos(2\pi Kd)\sin(2\pi K\varepsilon)) \end{bmatrix} \quad (7\text{-}2)$$

$$I_{C+} = a^2 + b^2 - 2ab\cos(\phi - 2\pi K(-d + \varepsilon)) \quad (7\text{-}3)$$
$$= a^2 + b^2 - 2ab\begin{bmatrix} \cos(\varphi)(\cos(2\pi Kd)\cos(2\pi K\varepsilon) + \sin(2\pi Kd)\sin(2\pi K\varepsilon)) - \\ \sin(\varphi)(\sin(2\pi Kd)\cos(2\pi K\varepsilon) - \cos(2\pi Kd)\sin(2\pi K\varepsilon)) \end{bmatrix} \quad (7\text{-}4)($$

Determination of Overlay Error

The overlay error ε can be determined from the intensity measurements of the $\pm 1^{st}$ diffraction orders coming from each target pad, e.g., using the equations (5-1) through (7-4). With the six independent signals captured using the $\pm 1^{st}$ diffraction orders and the three target pads from overlay target 120, there are only four unknowns, a, b, φ and ε. Therefore, three independent solutions for ε can be obtained. In order to get the three independent solutions, first, we need to define the following five quantities. From equations (5-1) through (7-4), $$q_1 \equiv (I_{A-}+I_{A+})-(I_{C-}+I_{C+}) = 8ab\sin(2\pi K\epsilon)\cos(\phi)\sin(2\pi Kd) \quad (8\text{-}1)$$

$$q_2 \equiv 2(I_{B-}-I_{B+}) = 8ab\sin(2\pi K\epsilon)\sin(\phi) \quad (8\text{-}2)$$

$$q'_2 \equiv (I_{A-}-I_{A+})+(I_{C-}-I_{C+}) = 8ab\sin(2\pi K\epsilon)\sin(\phi)\cos(2\pi Kd) \quad (8\text{-}3)$$

$$q_3 \equiv (I_{A-}+I_{A+})-2(I_{B-}+I_{B+})+(I_{C-}-I_{C+}) = 8ab\cos(2\pi K\epsilon)\cos(\phi)\cdot 2\sin^2(\pi Kd) \quad (8\text{-}4)$$

$$q_4 \equiv (I_{A-}-I_{A+})-(I_{C-}-I_{C+}) = 8ab\cos(2\pi K\epsilon)\sin(\phi)\sin(2\pi Kd) \quad (8\text{-}5)$$

Notice that all the above quantities depend on $\epsilon$ or the film thickness between the two overlaid layers in the overlay target 120.

Now, we define the following five quantities to achieve a notational convenience.

$$Q_1 \equiv \frac{q_1}{\sin(2\pi Kd)} = 8ab\sin(2\pi K\epsilon)\cos(\varphi) \quad (9\text{-}1)$$

$$Q_2 \equiv q_2 = 8ab\sin(2\pi K\epsilon)\sin(\varphi) \quad (9\text{-}2)$$

$$Q'_2 \equiv \frac{q'_2}{\cos(2\pi Kd)} = 8ab\sin(2\pi K\epsilon)\sin(\varphi) \quad (9\text{-}3)$$

$$Q_3 \equiv \frac{q_3}{2\sin^2(\pi Kd)} = 8ab\cos(2\pi K\epsilon)\cos(\varphi) \quad (9\text{-}4)$$

$$Q_4 \equiv \frac{q_4}{\sin(2\pi Kd)} = 8ab\cos(2\pi K\epsilon)\sin(\varphi) \quad (9\text{-}5)$$

We can see that the three independent overlay error solutions for $\epsilon$ can be derived from equations (9-1) through (9-5). That is, a pair of equations, (9-1) and (9-4), provides one solution, $$\tan(2\pi K\epsilon) = \frac{Q_1}{Q_3} = \quad (10\text{-}1)$$

$$\tan(\pi Kd)\frac{(I_{A-}+I_{A+})-(I_{C-}+I_{C+})}{(I_{A-}+I_{A+})-2(I_{B-}+I_{B+})+(I_{C-}+I_{C+})} \text{ if } \cos(\varphi) \neq 0.$$

As can be seen in equation, 10-1, the intensity values for pads A and C in the first dark field image, designed by "+", and the second dark field image, designated by "−", are combined to generate a signal value in the numerator, while intensity values for the three pads A, B, and C in the first dark field image and the second dark field image are combined to generate a reference value in the denominator. By comparing the signal value to the reference value, a value is generated that is proportional to the overlay error.

Pair of equations, (9-2) and (9-5), provides another solution, $$\tan(2\pi K\epsilon) = \quad (10\text{-}2)$$

$$\frac{Q_2}{Q_4} = \sin(2\pi Kd)\frac{2(I_{B-}-I_{B+})}{(I_{A-}-I_{A+})-(I_{C-}-I_{C+})} \text{ if } \sin(\varphi) \neq 0.$$

As can be seen in equation, 10-2, the intensity values in the first dark field image (+) and the second dark field image (−) for pad B are combined to generate a signal value in the numerator, while intensity values in the first dark field image and the second dark field image for pad A and for pad C are combined to generate a reference value in the denominator. By comparing the signal value to the reference value, a value is generated that is proportional to the overlay error.

Finally a pair of equations, (9-3) and (9-5), provides the third solution, $$\tan(2\pi K\epsilon) = \quad (10\text{-}3)$$

$$\frac{Q'_2}{Q_4} = \tan(2\pi Kd)\frac{(I_{A-}-I_{A+})+(I_{C-}-I_{C+})}{(I_{A-}-I_{A+})-(I_{C-}+I_{C+})} \text{ if } \sin(\varphi) \neq 0$$

The last solution (10-3) does not require the middle target pad and needs only the two outer target pads A and C, illustrated in FIG. 6. This two pad solution of equation 10-3, unfortunately, does not work when $\sin(\phi)=0$. The first and second solutions, (10-1) and (10-2) use all three target pads, but add two independent solutions. It should be noted that each of the solutions suffers from a separate critical problem. For example, the first solution (10-1) does not work if $\cos(\phi)=0$ and the second and third solutions, (10-2) and (10-3) do not work if $\sin(\phi)=0$. In other words, the first overlay error solution and the second and third overlay error solutions have measurement nulls for different structure parameters of the overlay target. That is, the robustness of each individual solution depends critically on the film thickness between the two interleaving target gratings in the overlay target 120. To achieve reliable overlay measurements regardless of film thickness change or variation, the overlay error solutions are used together, i.e., individually or in combination, to eliminate the zero sensitivity problem. The present embodiment may solve the problem elegantly by combining the separate solutions in complex plane because $Q_1$ is proportional to $\cos(\phi)$ while $Q_2$ and $Q'_2$ are proportional to $\sin(\phi)$ and $\cos(\phi)$ and $\sin(\phi)$ form a quadrature in complex plane. Therefore, the problem can be overcome using a weighted quadrature combination in the complex plane. In order to do that, we define the following two complex quantities.

$$G \equiv \alpha Q_1 + i(\beta Q_2 + \gamma Q'_2) = 8ab\sin(2\pi K\epsilon)[\alpha\cos(\phi)+i(\beta+\gamma)\sin(\phi)] \quad (11\text{-}1)$$

$$H \equiv \alpha Q_3 + i(\beta+\gamma)Q_4 = 8ab\cos(2\pi K\epsilon)[\alpha\cos(\phi)+i(\beta+\gamma)\sin(\phi)] \quad (11\text{-}2)$$

where $\alpha$, $\beta$, $\gamma$ are weights chosen. Only two of them are independent. (11-3)

From equations (11-1) and (11-2), the overlay error is expressed as $$\tan(2\pi K\epsilon) = \tan\left(2\pi\frac{\epsilon}{p}\right) = \frac{G}{H} = \frac{\alpha Q_1 = i(\beta Q_2 + \gamma Q'_2)}{\alpha Q_3 + i(\beta+\gamma)Q_4} \quad (12\text{-}1)$$

By equations (8-1) through (9-5), equation (12-1) can also be expressed as $$\tan\left(2\pi\frac{\epsilon}{p}\right) = \frac{\alpha\frac{(I_{A-}+I_{A+})-(I_{C-}+I_{C+})}{\sin(2\pi Kd)} + i\left(\begin{array}{l}\frac{2\beta(I_{B-}-I_{B+})+}{\gamma\frac{(I_{A-}-I_{A+})+(I_{C-}-I_{C+})}{\cos(2\pi Kd)}}\end{array}\right)}{\alpha\frac{(I_{A-}+I_{A+})-2(I_{B-}+I_{B+})+(I_{C-}+I_{C+})}{2\sin^2(\pi Kd)} + i(\beta+\gamma)\frac{(I_{A-}-I_{A+})+(I_{C-}-I_{C+})}{\sin(2\pi Kd)}} \quad (12\text{-}2)$$

Equation (12-1) (or (12-2)) is the most general expression for overlay error ε. The best values for the weights, α, β and γ, will be different for different cases. They can also be different across the wafer. They can be different even across a single die if multiple targets are printed inside a single die. However, they can be determined through simulations or experiments. An appropriate change of the weights, as determined empirically or experimentally, across the wafer or die can improve the accuracy of overlay measurements. Note that only two of the three weights, α, β and γ, are independent because dividing or multiplying the numerator and denominator of equations (12-1) and (12-2) simultaneously with a non-zero number does not affect the overlay result. In other words, only their relative, not absolute, weights matter. The general expression reduces to equation (10-1), (10-2) and (10-3) respectively if we choose β=γ0, α=γ=0 and α=β=0 respectively. Therefore, the general expression includes the three independent solutions as special cases. The real and imaginary parts of equations (11-1) and (11-2) cannot be zero simultaneously as long as α and β+γ are chosen to be non-zero. Therefore, equation (12-1) or (12-2) can produce reliable overlay error results even with illuminating light of a single wavelength regardless of film thickness change or variation between the two interleaving target gratings. The equations also work for the no film case such as double patterning; they do not require different duty cycles for the two interleaving target gratings even in the double patterning case. They can produce a reliable overlay error results with any grating duty cycle. This kind of low or no sensitivity to film thickness change or variation even with single wavelength is advantageous with respect to conventional overlay measurement devices.

If we want to make the overlay result completely insensitive to the film thickness or its variation, we can choose $$\alpha = \beta + \gamma \quad (13\text{-}1)$$

then, by equations (11-1) and (11-2), $$G = \alpha Q_1 + i(\beta Q_2 + \gamma Q'_2) = 8ab \sin(2\pi K\epsilon)(\beta+\gamma)\exp(i\phi) \quad (13\text{-}2)$$

$$H = \alpha Q_3 + i(\beta+\gamma)Q_4 = 8ab \cos(2\pi K\epsilon)(\beta+\gamma)\exp(i\phi) \quad (13\text{-}3)$$

The magnitudes of G and H do not depend on φ or film thickness variation. Therefore, the overlay measurement becomes completely insensitive to the film thickness variation between the two interleaving target gratings. In this case, the overlay error is expressed as $$\tan\left(2\pi\frac{\varepsilon}{p}\right) = \frac{(\beta+\gamma)Q_1 + i(\beta Q_2 + \gamma Q'_2)}{(\beta+\gamma)(Q_3 + iQ_4)} \quad (13\text{-}4)$$

Thus, with the use of three pads A, B, C, in overlay target 120, instead of using two pads, for each of x- and y-overlay measurements, we can not only avoid the zero-sensitivity pitfall completely but also make the overlay measurement completely insensitive to film thickness variation even with single wavelength.

It should be noted that while in ideal cases, the imaginary part of equation (12-1) or (12-2) must be zero, with real measurement data, however, it can have a small imaginary component. This is not a serious problem as long as the imaginary component is smaller than the overlay measurement error budget. The small imaginary component can be ignored or used to assess how robust the measurement is.

Equation (12-1) or (12-2) provides the overlay error. However, obtaining the overlay error through the data regression process using the target image model may be better because regression can use all the measured data and can take care of many error sources such as the interference between the images of different target pads, focus error, optical system aberrations, the mixing of diffraction orders due to finite target size, etc. In this case, the overlay error value obtained from the analytical solution, (12-1) or (12-2), can be used as the starting overlay value in the regression. The image modeling in this case is much simpler than optical critical dimension (OCD) modeling because it requires only target pitch and offset information, and does not require target structure information.

The derivations presented here ignored high order terms and interactions, as the contributions from high orders are expected to be small or negligible when the incidence angle of illumination beam is so high that only one diffraction order, either +1st or −1st, is propagating or radiative even inside the film layers between the two interleaving target gratings.

Additionally, as targets get smaller, brighter illumination sources are needed in order to be able to collect enough number of signal photons without sacrificing the throughput. Lasers are one of the preferred sources for small target applications because they are one of the brightest sources. However, the choice of wavelengths is very limited with lasers. Consequently, when lasers are adopted as source, it is hard to avoid the zero-sensitivity pitfalls with the conventional DBO solution with two target pads. Thus, the present embodiment, which does not have zero-sensitivity pitfalls even with single wavelength, is better-suited for laser illuminated DBO applications than conventional solutions.

Figure 11A:
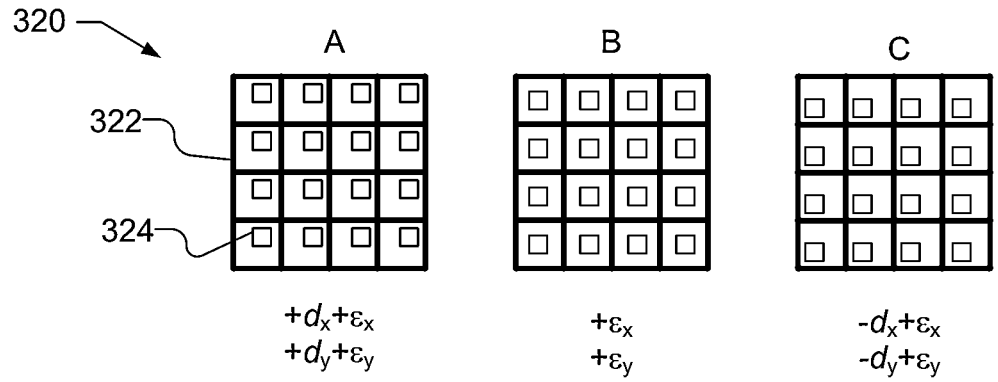
FIGS. 11A, 11B, and 11C illustrate variations of the overlay target that may be used with the dark field diffraction based overlay metrology device.
Figure 11B:
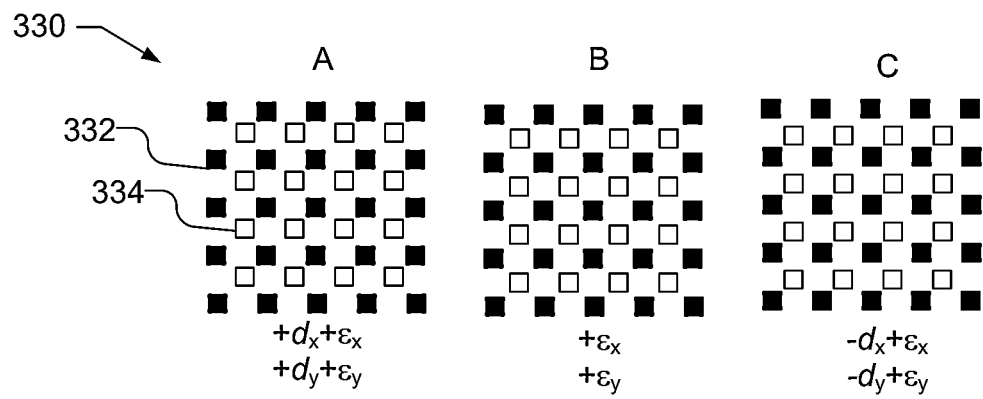
Figure 11C:
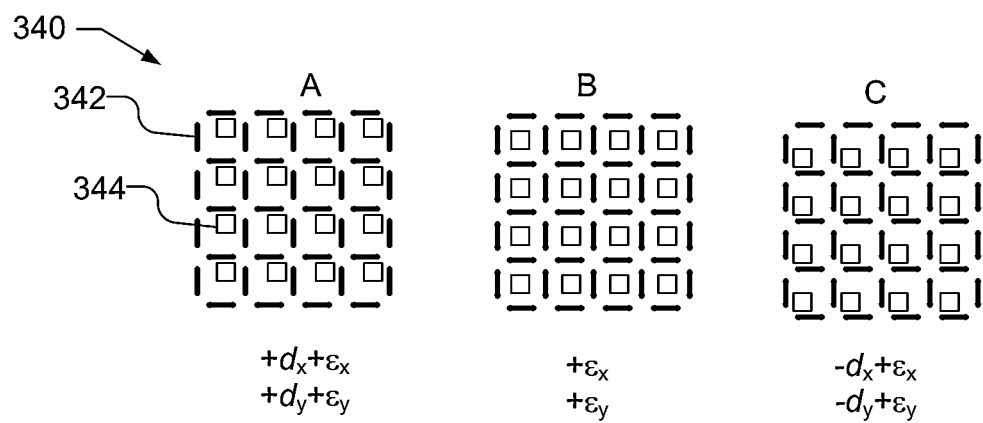

Minimizing the number of target pads is important for many applications, especially when the real estate in the sample assignable to overlay targets is highly limited. FIGS. 11A, 11B, and 11C illustrates a variation of the overlay target, in which the x- and y-targets pads are combined, thereby reducing the target design from six pads for both the x- and y-overlay measurements, to only three target pads for the x- and y-overlay measurements. The use of a combined x and y direction overlay targets may result in the intermixing of the diffracted light for the x- and y-directions. However, this may be avoided by blocking diagonal diffraction orders at the pupil plane using, e.g., pupil aperture plate 130 in FIG. 5, and/or employing an image model based regression algorithm for signal processing.

FIG. 11A, by way of example, is an overlay target 320 with three measurement pads A, B, C, that is formed with crate shaped structures 322 in one grating and an array of small boxes 324 in the other grating with folding symmetry in the x-direction and the y-direction. The overlay target 230 is well-suited for layer-over-layer overlay measurements because the diffraction efficiencies of crate and box array can be similar if the crate is printed in lower layer and the box array is printed in top layer.

FIG. 11B illustrates another overlay target 330 with folded symmetry, in which both gratings are made of array of boxes 332 and 334. The overlay target 330 is well-suited for double or multiple patterning because the diffraction efficiencies of the two interleaving box-array targets are expected to be similar when they are printed in the same plane during double or multiple patterning process.

FIG. 11C illustrates another overlay target 340 with folded symmetry, with crates 342 and an array of boxes 344, in which the corners of the crates 342 are open to facilitate an unobstructed flow of photoresist during photoresist coating process. Easier flow of photoresist usually reduces the asymmetry in target structure.

Figure 12:
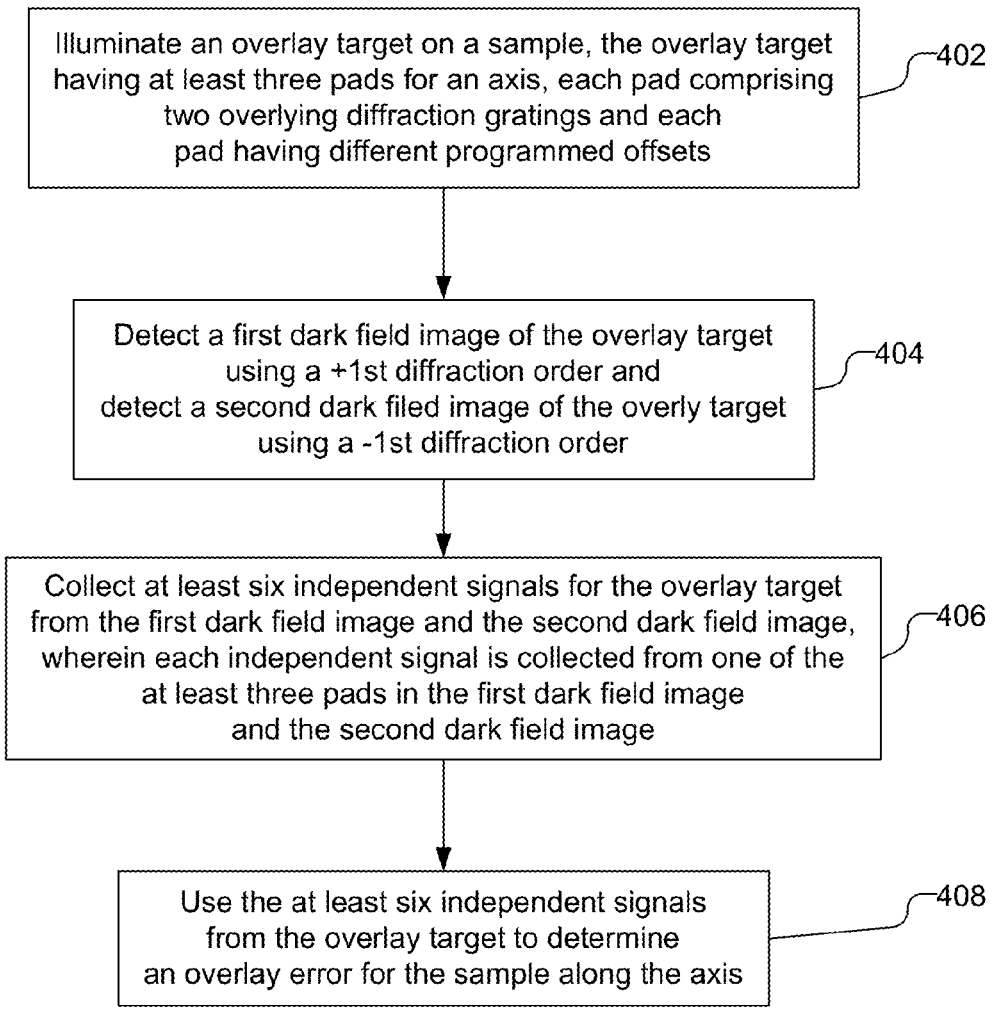
FIG. 12 is a flow chart illustrating a method of performing dark field diffraction based overlay.

FIG. 12 is a flow chart illustrating a method of performing dark field diffraction based overlay. As illustrated, an overlay target on a sample is illuminated (402). The overlay target has at least three pads for an axis. Each pad includes two overlaying diffraction gratings, which may be formed on overlaying layers, without or without an intervening layer, or may be overlaying on the same layer. Each pad has a different programmed offset. If desired, a second overlay target may be illuminated for an orthogonal second axis or the overlay target may include pads associated with the second axis. The overlay target may be illuminated using two obliquely incident beams of light with the same angles of incidence but opposite azimuth angles, as illustrated in FIG. 1, or using normally incident light, as illustrated in FIG. 7.

A first dark field image of the overlay target using a +1st diffraction order and a second dark field image of the overlay target using a −1st diffraction order are detected (404). At least six independent signals are collected for the overlay target from the first dark field image and the second dark field image (406). Each independent signal is collected from one of the at least three pads in the first dark field image and the second dark field image. The at least six independent signals from the overlay target are used to determine an overlay error for the sample along the axis (408).

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
    illuminating an overlay target on a sample, the overlay target having at least three pads for an axis, each pad comprising two overlaying diffraction gratings and each pad having different programmed offsets between the two overlaying diffraction gratings;
    detecting a first dark field image of the overlay target using a +$1^{st}$ diffraction order and detecting a second dark field image of the overlay target using a −$1^{st}$ diffraction order;
    collecting at least six independent signals for the overlay target from the first dark field image and the second dark field image, wherein each independent signal is collected from one of the at least three pads in the first dark field image and the second dark field image; and
    using the at least six independent signals from the overlay target to determine an overlay error for the sample along the axis.

2. The method of claim 1, wherein illuminating the overlay target comprises:
    providing a first light beam that is obliquely incident on the overlay target at an angle of incidence and at a first azimuth angle; and
    providing a second light beam that is obliquely incident on the overlay target at the angle of incidence and at a second azimuth angle that is opposite the first azimuth angle;
    wherein the first light beam produces the +$1^{st}$ diffraction order and the second light beam produces the −$1^{st}$ diffraction order.

3. The method of claim 1, wherein illuminating the overlay target comprises:
    providing a light beam that is normally incident on the overlay target and the normally incident light beam produces the +$1^{st}$ diffraction order and the −$1^{st}$ diffraction order.

4. The method of claim 1, wherein the overlay target is a first overlay target for a first axis, the method further comprising:
    illuminating a second overlay target on the sample, the second overlay target having at least three pads for a second axis that is orthogonal to the first axis, each pad comprising two overlaying diffraction gratings and each pad having different programmed offsets between the two overlaying diffraction gratings;
    detecting a third dark field image of the second overlay target using a +$1^{st}$ diffraction order from the second overlay target and detecting a fourth dark field image of the second overlay target using a −$1^{st}$ diffraction order;
    collecting at least six independent signals for the second overlay target from the third dark field image and the fourth dark field image, wherein each independent signal is collected from one of the at least three pads in the third dark field image and the fourth dark field image; and
    using the at least six independent signals from the second overlay target to determine a second overlay error for the sample along the second axis.

5. The method of claim 1, wherein the axis is a first axis, and wherein the at least three pads of the overlay target are associated with a second axis that is orthogonal to the first axis, the method further comprising:
    detecting a third dark field image of the overlay target using a +$1^{st}$ diffraction order aligned with the second axis and detecting a fourth dark field image of the overlay target using a −$1^{st}$ diffraction order aligned with the second axis;
    collecting a second set of at least six independent signals for the overlay target from the third dark field image and the fourth dark field image; and
    using a second set of the at least six independent signals from the overlay target to determine a second overlay error for the sample along the second axis.

6. The method of claim 1, wherein at least two pads of the overlay target have programmed offsets between the two overlaying diffraction gratings of equal magnitude and opposite direction.

7. The method of claim 1, wherein the overlay target comprises three pads, the two overlaying diffraction gratings in each pad being interleaved, and wherein one pad has no programmed offset.

8. The method of claim 1, wherein the overlay target comprises more than three pads.

9. The method of claim 1, wherein the overlay target has folding symmetry.

10. The method of claim 1, wherein collecting the at least six independent signals for the overlay target comprises determining an intensity value for each of the at least three pads in the first dark field image and for each of the at least three pads in the second dark field image.

11. The method of claim 10, wherein the overlay target is held at an image plane and the intensity value for each of the at least three pads in the first dark field image are acquired simultaneously.

12. The method of claim 1, wherein using the at least six independent signals from the overlay target to determine the overlay error for the sample along the axis comprises using a plurality of overlay error solutions based on different combinations of the at least six independent signals, wherein two of overlay error solutions have measurement nulls for different structure parameters.

13. The method of claim 12 wherein the plurality of overlay error solutions are used together to avoid a zero sensitivity problem.

14. The method of claim 1, wherein using the at least six independent signals from the overlay target to determine the overlay error for the sample along the axis comprises:
   combining intensity values for a first pad and a second pad in the first dark field image and the second dark field image to generate a signal value;
   combining intensity values for the first pad, the second pad and a third pad in the first dark field image and the second dark field image to generate a reference value; and
   comparing the signal value to the reference value to generate a value proportional to the overlay error.

15. The method of claim 1, wherein using the at least six independent signals from the overlay target to determine the overlay error for the sample along the axis comprises:
   combining intensity values in the first dark field image and the second dark field image for a first pad to generate a signal value;
   combining intensity values in the first dark field image and the second dark field image for a second pad and for a third pad to generate a reference value; and
   comparing the signal value to the reference value to generate a value proportional to the overlay error.

16. The method of claim 1, wherein using the at least six independent signals from the overlay target to determine the overlay error for the sample along the axis comprises using a weighted combination in a complex plane of a plurality of overlay error solutions, wherein at least two of the overlay solutions form a quadrature in the complex plane.

17. A metrology device for measuring overlay error of a sample, the metrology device comprising:
   a light source that produces a light beam to illuminate an overlay target on the sample, the overlay target having at least three pads for an axis, each pad comprising two overlaying diffraction gratings and each pad having different programmed offsets between the two overlaying diffraction gratings;
   dark field imaging optics and at least one detector configured to detect a first dark field image using a $+1^{st}$ diffraction order and to detect a second dark field image using a $-1^{st}$ diffraction order; and
   a processor coupled to receive at least six independent signals for the overlay target from the first dark field image and the second dark field image, wherein each independent signal is from one of the at least three pads in the first dark field image and the second dark field image, and the processor being configured to use the at least six independent signals from the overlay target to determine an overlay error for the sample along the axis.

18. The metrology device of claim 17, wherein the light beam is a first light beam that is obliquely incident on the overlay target at an angle of incidence and a first azimuth angle; the metrology device further comprising a second light beam that is obliquely incident on the overlay target at the angle of incidence and at a second azimuth angle that is opposite the first azimuth angle; wherein the dark field imaging optics and the at least one detector are configured to detect the first dark field image using the $+1^{st}$ diffraction order resulting from the first light beam and detect the second dark field image using the $-1^{st}$ diffraction order resulting from the second light beam.

19. The metrology device of claim 17, wherein the light beam is normally incident on the overlay target; and wherein the dark field imaging optics and the at least one detector are configured to detect the first dark field image using the $+1^{st}$ diffraction order resulting from the light beam and detect the second dark field image using the $-1^{st}$ diffraction order resulting from the light beam.

20. The metrology device of claim 17, wherein the overlay target is a first overlay target for a first axis, the light beam illuminates a second overlay target on the sample, the second overlay target having at least three pads for a second axis that is orthogonal to the first axis, each pad comprising two overlaying diffraction gratings and each pad having different programmed offsets between the two overlaying diffraction gratings;
   wherein the dark field imaging optics and the at least one detector are configured to detect a third dark field image of the second overlay target using a $+1^{st}$ diffraction order from the second overlay target and to detect a fourth dark field image of the second overlay target using a $-1^{st}$ diffraction order;
   collecting at least six independent signals for the second overlay target from the third dark field image and the fourth dark field image, wherein each independent signal is collected from one of the at least three pads in the third dark field image and the fourth dark field image; and
   wherein the processor is coupled to receive a second set of at least six independent signals for the second overlay target from the third dark field image and the fourth dark field image, and the processor being configured to use the second set of at least six independent signals from the second overlay target to determine a second overlay error for the sample along the second axis.

21. The metrology device of claim 17, wherein the axis is a first axis, and wherein the at least three pads of the overlay target are associated with a second axis that is orthogonal to the first axis;
   wherein the dark field imaging optics and the at least one detector are configured to detect a third dark field image of the overlay target using a $+1^{st}$ diffraction order aligned with the second axis and detect a fourth dark field image of the overlay target using a $-1^{st}$ diffraction order aligned with the second axis;
   wherein the processor is coupled to receive a second set of at least six independent signals from the third dark field image and the fourth dark field image, and the processor being configured to use the second set of at least six independent signals to determine a second overlay error for the sample along the second axis.

22. The metrology device of claim 17, wherein at least two pads of the overlay target have programmed offsets between the two overlaying diffraction gratings of equal magnitude and opposite direction.

23. The metrology device of claim 17, wherein the overlay target comprises three pads, the two overlaying diffraction gratings in each pad being interleaved, and wherein one pad has no programmed offset.

24. The metrology device of claim 17, wherein the overlay target comprises more than three pads.

25. The metrology device of claim 17, wherein the overlay target has folding symmetry.

26. The metrology device of claim 17, wherein the at least six independent signals for the overlay target comprises intensity values for each of the at least three pads in the first dark field image and for each of the at least three pads in the second dark field image.

27. The metrology device of claim 26, wherein the overlay target is held at an image plane of the dark field imaging optics and the intensity value for each of the at least three pads in the first dark field image are detected simultaneously.

28. The metrology device of claim 17, wherein the processor is configured to use the at least six independent signals from the overlay target to determine the overlay error for the sample along the axis by being configured to us a plurality of overlay error solutions based on different combinations of the at least six independent signals, wherein two of overlay error solutions have measurement nulls for different structure parameters.

29. The metrology device of claim 28, wherein the plurality of overlay error solutions are used together to avoid a zero sensitivity problem.

30. The metrology device of claim 17, wherein the processor is configured to use the at least six independent signals from the overlay target to determine the overlay error for the sample along the axis by being configured to:
    combine intensity values for a first pad and a second pad in the first dark field image and the second dark field image to generate a signal value;
    combine intensity values for the first pad, the second pad and a third pad in the first dark field image and the second dark field image to generate a reference value; and
    compare the signal value to the reference value to generate a value proportional to the overlay error.

31. The metrology device of claim 17, wherein the processor is configured to use the at least six independent signals from the overlay target to determine the overlay error for the sample along the axis by being configured to:
    combine intensity values in the first dark field image and the second dark field image for a first pad to generate a signal value;
    combine intensity values in the first dark field image and the second dark field image for a second pad and for a third pad to generate a reference value; and
    compare the signal value to the reference value to generate a value proportional to the overlay error.

32. The metrology device of claim 17, wherein the processor is configured to use the at least six independent signals from the overlay target to determine the overlay error for the sample along the axis by being configured to use a weighted combination in a complex plane of a plurality of overlay error solutions, wherein at least two of the overlay solutions form a quadrature in the complex plane.

* * * * *